US009691493B1

(12) United States Patent
Pasotti et al.

(10) Patent No.: US 9,691,493 B1
(45) Date of Patent: Jun. 27, 2017

(54) DEVICE FOR GENERATING A VOLTAGE REFERENCE COMPRISING A NON-VOLATILE MEMORY CELL

(71) Applicants: STMicroelectronics S.r.l., Agrate Brianza (IT); STMicroelectronics Design & Application S.R.O., Praha (CZ)

(72) Inventors: Marco Pasotti, Travacò Siccomario (IT); Fabio De Santis, Milan (IT); Roberto Bregoli, Offlaga (IT); Dario Livornesi, Paderno Dugnano (IT); Sandor Petenyi, Milovice Nad Labem (CZ)

(73) Assignees: STMicroelectronics S.r.l., Agrate Brianza (IT); STMicroelectronics Design and Application S.R.O., Prague (CZ)

( * ) Notice: Subject to any disclaimer, the term of this patent is extended or adjusted under 35 U.S.C. 154(b) by 0 days.

(21) Appl. No.: 15/244,664

(22) Filed: Aug. 23, 2016

(30) Foreign Application Priority Data

Dec. 22, 2015 (IT) .................. 102015000086807

(51) Int. Cl.
 *G11C 16/10* (2006.01)
 *G11C 16/30* (2006.01)
 (Continued)

(52) U.S. Cl.
 CPC ............. *G11C 16/30* (2013.01); *G11C 5/147* (2013.01); *G11C 16/0408* (2013.01);
 (Continued)

(58) Field of Classification Search
 CPC .................... G11C 16/10; G11C 16/26
 (Continued)

(56) References Cited

U.S. PATENT DOCUMENTS

| 5,016,217 A | * | 5/1991 | Brahmbhatt | ........ G11C 11/5621 |
| | | | | 326/38 |
| 5,101,378 A | * | 3/1992 | Radjy | ................ G11C 16/0441 |
| | | | | 257/E27.103 |

(Continued)

OTHER PUBLICATIONS

Harrison, R.R. et al., "A CMOS Programmable Analog Memory-Cell Array Using Floating-Gate Circuits," IEEE Transactions on Circuits and Systems-II: Analog and Digital Signal Processing, vol. 48, No. 1, Jan. 2001, pp. 4-11.

(Continued)

*Primary Examiner* — Michael Tran
(74) *Attorney, Agent, or Firm* — Slater Matsil, LLP

(57) ABSTRACT

A device for generating a reference voltage includes a first non-volatile memory cell provided with a control-gate transistor and a reading transistor. The control-gate transistor includes a gate terminal, a body, a first conduction terminal and a second conduction terminal. The first conduction terminal and the second conduction terminal are connected together to form a control-gate terminal. The reading transistor includes a gate terminal that is connected to the gate terminal of the control-gate transistor to form a floating-gate terminal, a body, a third conduction terminal and a fourth conduction terminal. The device also includes a second, equivalent, memory cell. The source terminal of the first non-volatile memory cell and the source terminal of the second equivalent memory cell are connected together.

20 Claims, 11 Drawing Sheets

(51) Int. Cl.
*H01L 27/11521* (2017.01)
*G11C 16/28* (2006.01)
*G11C 16/04* (2006.01)
*G11C 5/14* (2006.01)

(52) U.S. Cl.
CPC .............. *G11C 16/10* (2013.01); *G11C 16/28* (2013.01); *H01L 27/11521* (2013.01)

(58) Field of Classification Search
USPC .......................................... 365/185.2, 185.24
See application file for complete search history.

(56) References Cited

U.S. PATENT DOCUMENTS

| | | | | |
|---|---|---|---|---|
| 5,652,722 | A * | 7/1997 | Whitefield | G01R 31/275 365/185.18 |
| 6,002,610 | A * | 12/1999 | Cong | G11C 16/0441 365/185.05 |
| 6,466,482 | B2 * | 10/2002 | Shukuri | G11C 16/0441 365/185.01 |
| 6,473,342 | B2 * | 10/2002 | Kim | G11C 16/0425 257/E29.129 |
| 7,709,307 | B2 * | 5/2010 | Kamath | H01L 21/28518 257/E21.68 |
| 7,746,695 | B2 * | 6/2010 | Ivanov | G11C 14/00 365/157 |
| 7,859,911 | B2 | 12/2010 | Teggatz et al. | |
| 8,009,483 | B2 * | 8/2011 | Kamiya | G11C 16/0441 365/185.18 |
| 8,304,309 | B2 * | 11/2012 | Bicksler | H01L 21/28273 257/319 |
| 8,582,363 | B2 * | 11/2013 | Lee | G11C 16/3409 365/185.11 |
| 8,693,256 | B2 | 4/2014 | Pasotti et al. | |
| 2009/0201742 | A1 | 8/2009 | Lee et al. | |
| 2009/0315526 | A1 | 12/2009 | Do Couto et al. | |
| 2010/0157706 | A1 * | 6/2010 | Cho | G11C 7/12 365/203 |
| 2011/0141805 | A1 * | 6/2011 | Tailliet | G11C 16/10 365/185.2 |
| 2011/0254521 | A1 | 10/2011 | Iacob et al. | |
| 2011/0303964 | A1 * | 12/2011 | Ueda | H01L 27/11524 257/317 |
| 2012/0087188 | A1 * | 4/2012 | Hsieh | G11C 16/08 365/185.05 |
| 2012/0294070 | A1 * | 11/2012 | Matsuzaki | G11C 11/404 365/149 |
| 2015/0027237 | A1 * | 1/2015 | Chakrabartty | G01B 7/18 73/862.68 |

OTHER PUBLICATIONS

Intersil, "Voltage References," http://www.intersil.com/content/intersil/en/products/data-converters/voltage-references.html, Download date: Jun. 22, 2016, 5 pages.

EDN Staff, "Intersil Acquires Xicor," EDN Network, http://www.edn.com/electronics-news/4333481/Intersil-Acquires-Xicor, Mar. 16, 2004, 3 pages.

Microchip Technology Inc., "MCP1710 Demo Board Use☐s Guide," Revision A, DS52095A, Oct. 2012, 20 pages.

Phang, K. et al., "Low Voltage, Low Power CMOS Bandgap References," University of Toronto, Dec. 2000, 20 pages.

Xicor; "Xicor Announces Precision Voltage Reference Technology Breakthrough; Proprietary Floating Gate Analog-FGA-Technology Enables Unprecedented Voltage Reference Performance," Business Wire, Apr. 22, 2003, 3 pages.

* cited by examiner

DEVICE FOR GENERATING A VOLTAGE REFERENCE COMPRISING A NON-VOLATILE MEMORY CELL

CROSS-REFERENCE TO RELATED APPLICATIONS

This application claims priority to Italian Application No. 102015000086807, filed on Dec. 22, 2015, which application is hereby incorporated herein by reference.

TECHNICAL FIELD

Embodiments of the invention provide a device for generating a voltage reference comprising a non-volatile memory cell.

BACKGROUND

Voltage regulators (VREG) play a very important role in modern electronics. Practically all systems, irrespective of their type (analog, digital, or mixed) require a supply.

The specifications for the supply voltage of complex systems become very stringent in regard to numerous factors, such as the level of precision of the voltage, the current-generation capacity, the dynamic response, and so forth. These specifications must be met by an adequate VREG device.

The absolute value of the regulated voltage principally depends upon the internal reference of the voltage generator (VREF). The majority of the devices currently developed and marketed are based upon the bandgap-reference (BGR) principle. This approach is currently used in a wide range of voltage regulators.

The bandgap implementation is relatively simple, can be applied practically to any technology, and the electrical parameters are able to meet the majority of current requirements.

On the other hand, if a few electrical parameters are pushed to the extreme, the bandgap implementation may no longer be satisfactory for some applications with particularly stringent requirements and hence can no longer be used.

As has been the, for proper operation, all electronic products require at least one reference voltage. The values of the reference voltage may be standard values or customized values, and typically in the latter case these values can be defined in the production stage or else be "programmed" and selected in-field during use of the product.

Consequently, the reference-voltage generator is the fundamental block present in all circuits, including completely analog circuits and circuits with mixed signals, such as analog-to-digital converters and digital-to-analog converters, DC-DC converters, regulators, linear low-dropout (LDO) regulators, and current references and comparison voltages in voltage comparators.

The new applications, such as wearable applications, for example, smartwatches or other devices, normally require a very low power supply.

As already mentioned, one of the most widely used and effective reference generators is the so-called bandgap reference. Its name derives from the fact that the voltage supplied at output is proportional to the value of the bandgap energy at zero degrees Kelvin of the semiconductor used (normally silicon is used, which has a bandgap of 1.12 eV at room temperature).

The principle on which bandgap circuits are based, especially for liquid-crystal oscillators (LCOs), may not meet the requirements of ultra-low-power systems.

In particular, the value of the reference voltage depends upon the semiconductor used to obtain the device, and this varies considerably as a function of temperature.

In various embodiments of known solutions, the voltage reference is obtained by adding together two voltages, appropriately weighted, with temperature coefficients opposite to one another. For example, in a bandgap generator, the voltage with negative temperature coefficient (CTAT—Complementary-To-Absolute Temperature) is obtained with a forward-biased diode, whereas the voltage with positive temperature coefficient (PTAT—Proportional-To-Absolute Temperature) is obtained from the voltage difference between two diodes with different ratio of area.

In addition, buffering operations are usually necessary for increasing the driving capacity or for obtaining different voltages (for example, values above the bandgap value Vbg), and high values of resistance (of the order of gigaohms) are necessary in order to obtain a precise trimming voltage (ultra-low-current scale).

However, the use of an ultra-low current leads to numerous disadvantages, such as leakage, difficult start-up conditions, dynamics in the bandgap.

Consequently, in an increasingly greater number of applications, the use of voltage references based upon the (embedded or low-dropout) bandgap principle is not possible on account of the constraints of energy consumption and occupation of area.

A classic way for obtaining what has just been described is illustrated in FIG. 1, which shows a typical architecture of a reference generator that exploits the bandgap principle.

In this embodiment, instead of the diodes mentioned above, two diode-connected bipolar transistors Q1 and Q2 are used. The reference voltage is acquired on the output of an operational amplifier. The bipolar transistors Q1 and Q2 are connected, respectively, to the inverting pin and to the positive pin via the resistances R1, R2, and R3.

These are solutions that are widely adopted and can be transformed in "particular" solutions or customized according to whether vertical or lateral bipolar transistors are present and according to particular design/technological constraints.

These solutions guarantee levels of precision in the region of 2% and current consumption higher than a few microamps (as described in the paper "Low Voltage, Low Power CMOS Bandgap References", Prof. K. Phang, Department of Electrical and Computer Engineering, University of Toronto).

In some cases, to counteract the process spread, which also derives from the use of resistors, in order to obtain a precise reference voltage also an operation of calibration may be necessary, which must then be stored and uploaded during start-up of the SoC (System-on-Chip), with consequent expenditure of area and additional architectural complications.

Classic bandgap implementations could moreover require addition of a buffer downstream when a current-driving capacity is necessary, or else addition of an operational amplifier in inverting configuration for reaching voltages higher than the bandgap voltage made available by such implementations.

The solution that overcomes these problems hence entails a considerable additional occupation of area, and this becomes a problem for small-sized devices, such as wearable devices.

Furthermore, once again in relation to classic implementations, in these solutions there arise problems linked to the use of passive components such as resistors, and particular attention in the layout stage is required.

The need to use resistors entails a considerable occupation of area, which frequently depends upon the devices present in the design technology.

The particular attention that must be paid in the layout stage for implementing the matching rules for compensating the process spread entails a further occupation of area, with an increase in size of the devices.

In addition, as for the resistors, also the layout of the operational amplifier requires attention in positioning and in implementation of matching for the differential pair and for the current mirrors. This attention is required in order to reduce the systematic offset and the process spread.

By way of example, areas in the region of 0.1 mm$^2$ are typical for these applications in BCD (Bipolar-CMOS-DMOS) technology.

An example of parameter that is very stringent is the quiescent current ($I_Q$), which represents the consumption of the regulator at rest. There are various products on the market that push the level of the quiescent current ($I_Q$) down to around 500 nA in no-load conditions.

This represents the entire current consumption of the voltage regulator, in such a way that it may be considered that the regulator works with approximately 100 nA.

It is possible to provide a device based upon the bandgap principle at this level with satisfactory electrical parameters and a reasonable area of silicon.

The problem could arise if the voltage regulator were to be required to work with a total current $I_Q$ of just 20 nA. Even though in theory the device with bandgap principle could work with a biasing current of just a few nanoamps, the fact that it requires resistances having values of the order of gigaohms renders this solution unusable. Also the considerations on the parasitic effects (leakage currents, parasitic capacitances) lead to these devices based on the bandgap principle becoming prohibitive, and other principles have to be contemplated.

Present on the market are multiple solutions for overcoming the limitations referred to above.

In terms of reduction of consumption the most interesting are based upon voltage references contained in non-volatile memory cells.

Inspiration may be drawn from the existing principles used for storing digital information in electrically programmable/erasable non-volatile memory cells (EEPROMs).

Digital information can be stored in a memory cell in the form of electric charge. Consequently, also analog information can be stored in a similar way.

The above idea has already been adopted. For example, the company Intersil uses a memory cell in its products that generate a voltage reference (see, for example, the document entitled Voltage References available at the URL http://www.intersil.com/en/products/data-converters/voltage-references.html).

The memory cell in itself has been produced and manufactured by the company Xicor in 2003, and is known under the name of Floating-Gate-Analog (FGA) cell and described in http://www.businesswire.com/news/home/20030422005199/en/Xicor-Announces-Precision-Voltage-Reference-Technology-Breakthrough.

FIG. 2 shows an analogic non-volatile memory cell, i.e., the principle diagram of an FGA cell marketed by the company Xicor.

The cell uses a floating terminal created between two capacitors, i.e., the external capacitor CE and the gate-to-source capacitor of the MOSFET. The voltage stored in the cell can be programmed via two devices that exploit the tunnelling effect for supplying or removing a charge.

A key factor of the analog cell is its capacity to hold the charge (voltage), which must last throughout the life of the device in worst-case conditions. For this reason, the leakages of all the components around the floating-gate terminal must be minimized.

A possible embodiment of the implementations alternative to the bandgap, is illustrated, for example, in FIG. 3.

FIG. 3 shows the principle diagram of voltage references based upon non-volatile memory (NVM) cells.

The above further solutions are described, for example, in U.S. Pat. No. 7,859,911 B2, filed in the name of the present applicant, in Harrison et al., A CMOS Programmable Analog Memory-Cell Array Using Floating-Gate Circuits, IEEE Transactions on Circuits and Systems II: Analog and Digital Signal Processing, Vol. 48, No. 1, January 2001, pp. 4-11, and in Microchip, MCP1017 Demo Board User's Guide, 2012, 20 pages.

SUMMARY

The present disclosure relates to a new solution for providing electronic devices for generation of reference voltages, which find various applications also in complex systems. In various embodiments, the disclosure regards applications for generating voltage references for ultra-low-power systems with reduced area. This solution can be used, for example, for embedded voltage references and for obtaining the main stage of the differential input for a high-performance low-dropout (LDO) device.

Embodiments of the invention make it possible to obtain devices that are able to generate precise voltage references, overcoming problems of occupation of area and of marked dependence upon temperature.

In particular embodiments, the solution relates to a device for generating a reference voltage comprising a first non-volatile memory cell, which includes a control-gate transistor and a reading transistor.

The control-gate transistor comprises a gate terminal, a body, and a first conduction terminal and a second conduction terminal, where the first and second conduction terminals are coupled together to form a control-gate terminal.

Furthermore, the reading transistor comprises a gate terminal coupled to the gate terminal (Gcg) of the control-gate transistor to form a floating-gate terminal, a body, and a third conduction terminal and a fourth conduction terminal.

The device also comprises a second, equivalent, memory cell.

Preferably, the source terminal of the first non-volatile memory cell and the source terminal of the second, equivalent, memory cell are connected together.

Finally, the reference voltage is acquired on the floating-gate terminal and is determined by the conditions of supply of the conduction terminals of the memory cell.

The analogic NVM cells enable electronic devices to be produced that present excellent electrical performance. In particular, the current consumption, which cannot be pushed below certain limits with the conventional solution (bandgap reference), can be significantly reduced by application of the NVM cell.

A voltage regulator having a minimum current consumption of 20 nA has been obtained using the above cell. The overall efficiency of the device is comparable to that of conventional devices, but in conditions of absence of load applied, a current consumption of just 20 nA has been achieved. There are further advantages of the cell, namely, the possibility of programming the stored voltage to a desired value and also the possibility of erasing the cell.

The claims form an integral part of the description of one or more embodiments as provided herein.

BRIEF DESCRIPTION OF THE DRAWINGS

One or more embodiments will now be described purely by way of non-limiting example, with reference to annexed drawings, wherein.

DETAILED DESCRIPTION OF ILLUSTRATIVE EMBODIMENTS

In the ensuing description, one or more specific details are illustrated, aimed at enabling an in-depth understanding of various embodiments provided by way of example. The embodiments may be obtained without one or more of the above specific details, or else with other methods, components, materials, etc. In other cases, known structures, materials, or operations are not represented or described in detail so that some aspects of the embodiments will not be obscured.

Reference to "an embodiment" or "one embodiment" in the framework of the present description is meant to indicate that a particular configuration, structure, or characteristic described in relation to the embodiment is comprised in at least one embodiment. Hence, phrases such as "in an embodiment" or "in one embodiment" that may be present in one or more points of the present description do necessarily refer to one and the same embodiment. In addition, particular configurations, structures, or characteristics may be combined in any adequate way in one or more embodiments.

The references used herein are provided merely for convenience and hence do not define the sphere of protection or the scope of the embodiments.

A different implementation of the analogic non-volatile memory (NVM) cell has been developed. The cell has been developed specifically for application in LDO voltage regulators.

Of course, this fact does not limit its application to other types of integrated circuits (ICs).

In addition, the above cell contains great potential as regards provision of voltage references, and in many cases this solution can substitute the conventional bandgap-reference (BGR) solution.

The solution described herein mainly sets itself two primary objectives, namely, integration of the cells within LDO voltage regulators and the use of single-polysilicon-layer technology.

Figure 1:
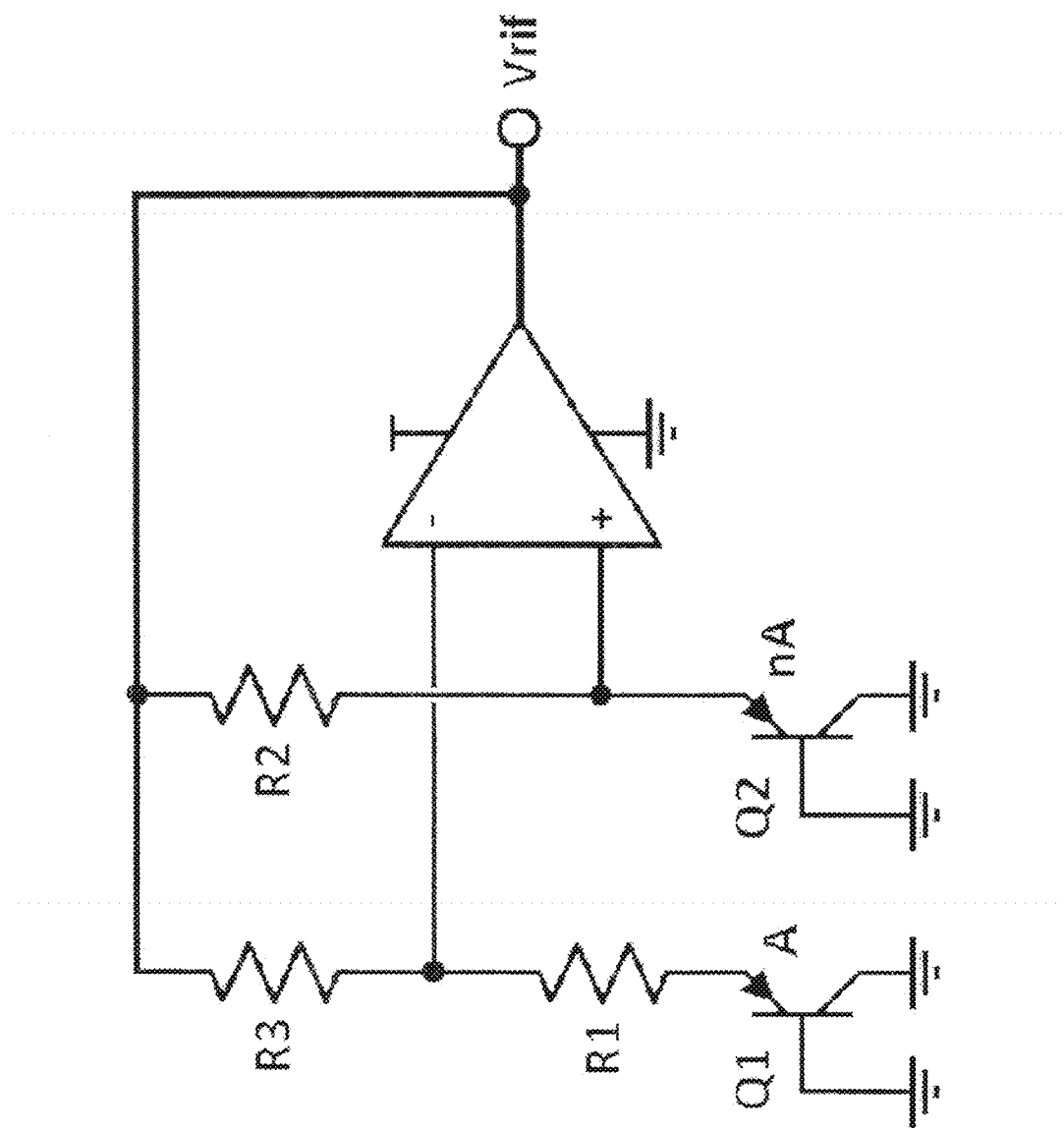
FIG. 1 shows a bandgap-voltage generation circuit.
Figure 2:
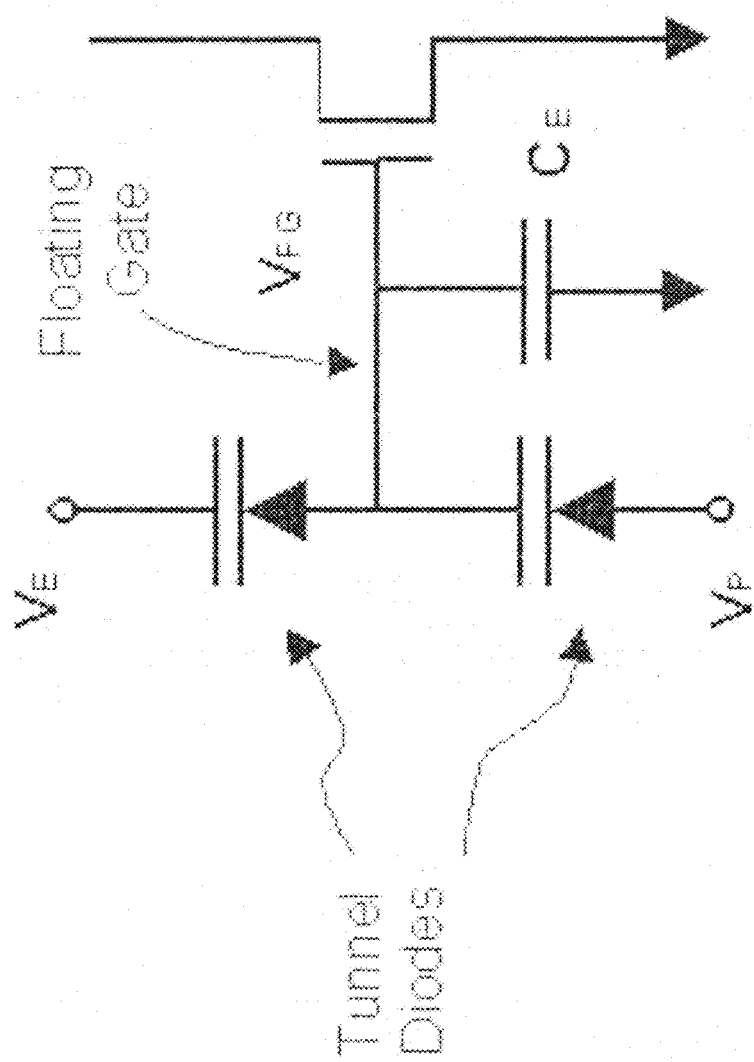
FIG. 2 shows an analogic non-volatile memory cell, the FGA cell manufactured by the company Xicor.
Figure 3:
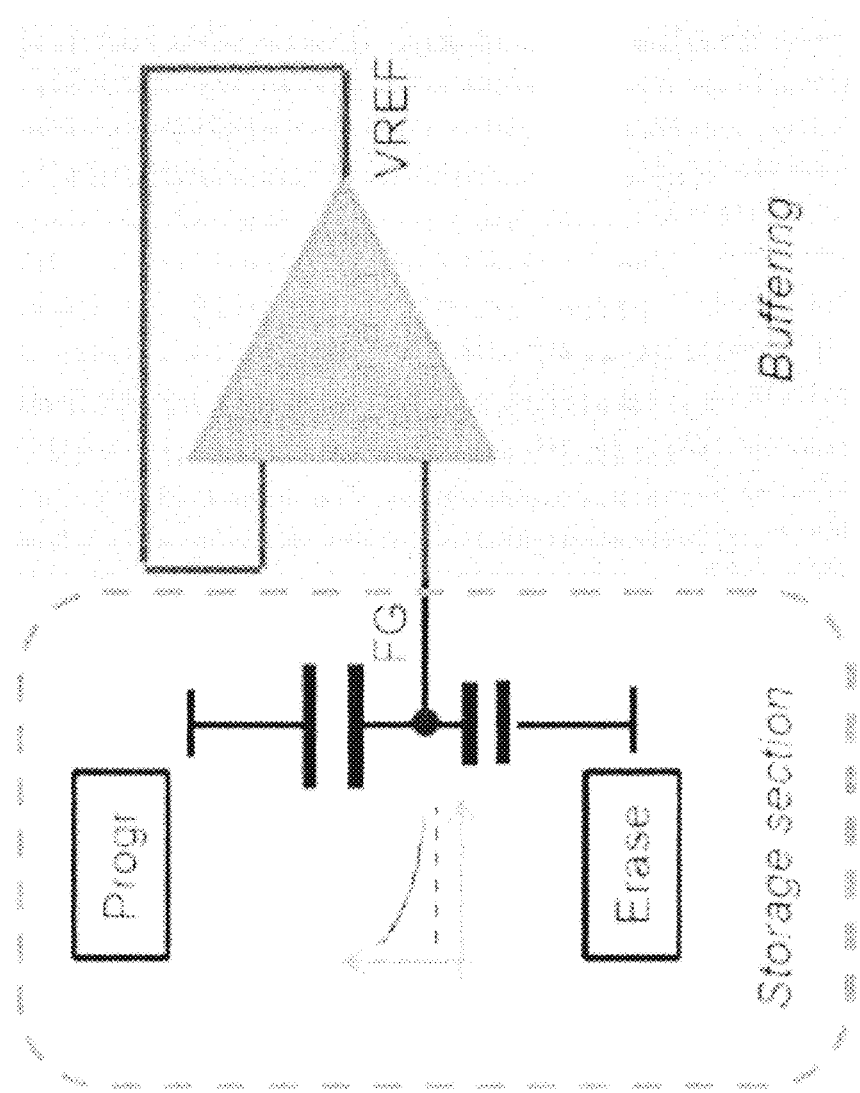
FIG. 3 shows a voltage-generation device based upon a memory cell.
Figure 4:
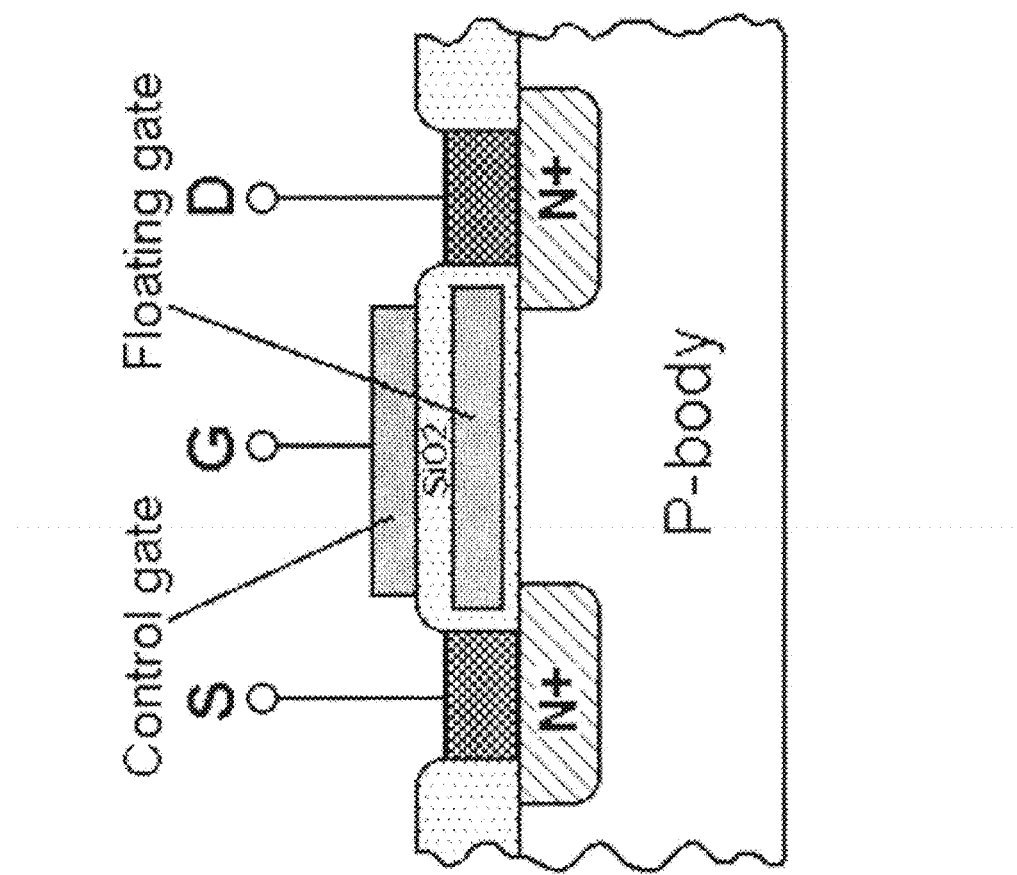
FIG. 4 shows a floating-gate MOSFET in double-polysilicon technology.
Figure 5:
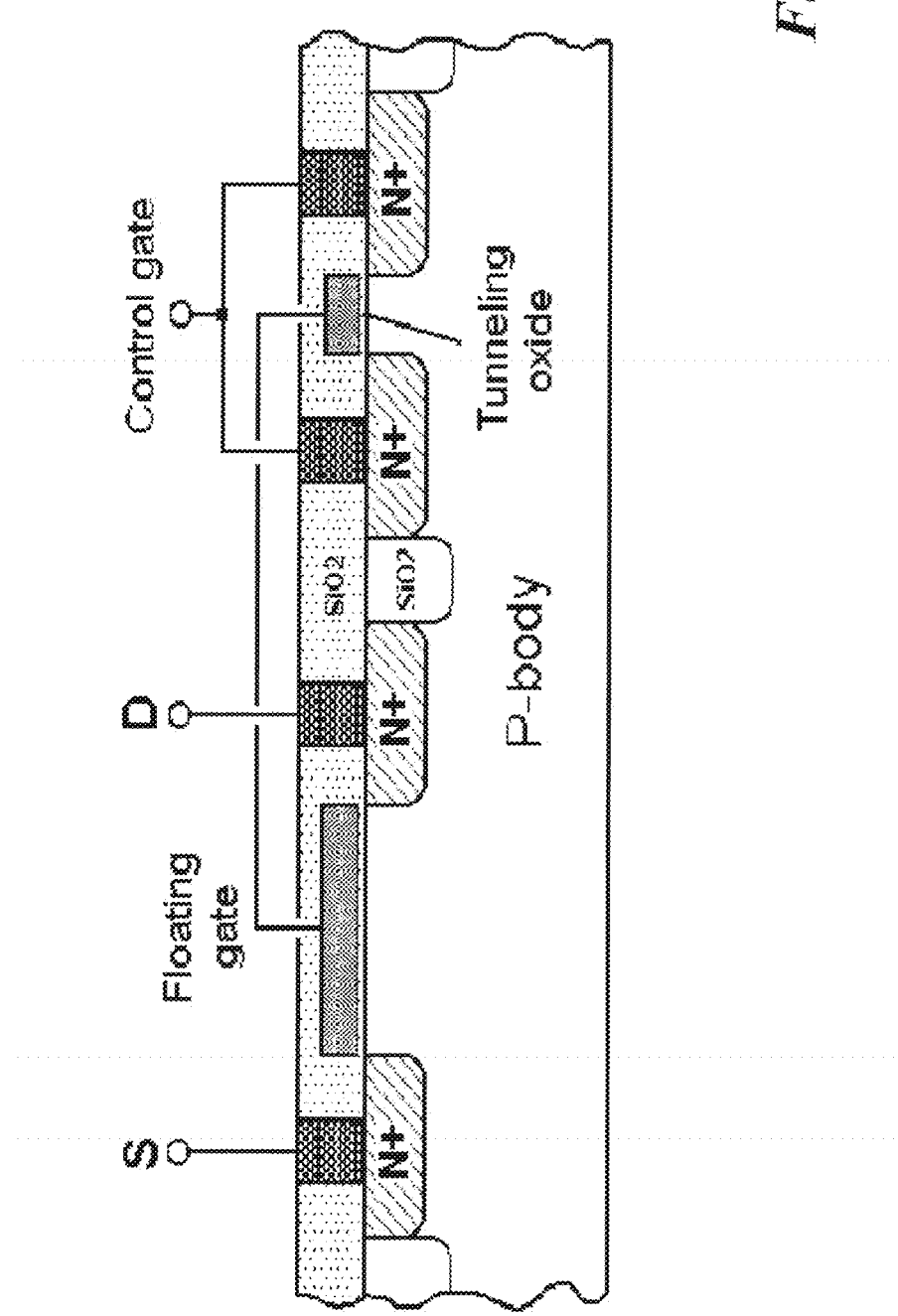
FIG. 5 shows a low-cost EEPROM memory cell in single-polysilicon technology.

The latter objective implies the use of a low-cost EEPROM solution where, instead of a double-polysilicon technology, as shown in FIG. 4, a single-polysilicon technology, as shown in FIG. 5, is used.

The floating terminal in FIG. 5 is created by the lateral structure containing two adjacent MOSFETs with shorted gate terminals that represent the floating-gate terminal.

The active area of the two MOSFETs present is shared in a non-uniform way. This causes an uneven distribution of the voltage on the two capacitors connected in series. By applying a high voltage across the structure, the capacitor with smaller area is subject to a higher voltage and approaches the breakdown voltage that leads to the Fowler-Nordheim tunnelling effect.

This leads to the passage of charge towards the floating gate. After removal of the programming voltage, the charge remains trapped for a long time. By applying a voltage with opposite polarity, the charge stored can be removed via the same physical effect (Fowler-Nordheim).

The key factor that affects retention of the charge is the thickness of the oxide tunnel, as shown by the example provided in Table 1 below.

TABLE 1

Examples of time of charge retention as a function of oxide thickness

| Oxide thickness [nm] | Time for 20% loss of charge |
|---|---|
| 4.5 | 4 min |
| 5 | 1 day |
| 6 | 0.5 up to 6 yrs |

In addition to the above objectives, there exist also further electrical specifications that must be met for LDO devices.

Consequently, various embodiments envisage integration of a non-volatile memory cell in a differential stage of the LDO error amplifier.

Figure 6:
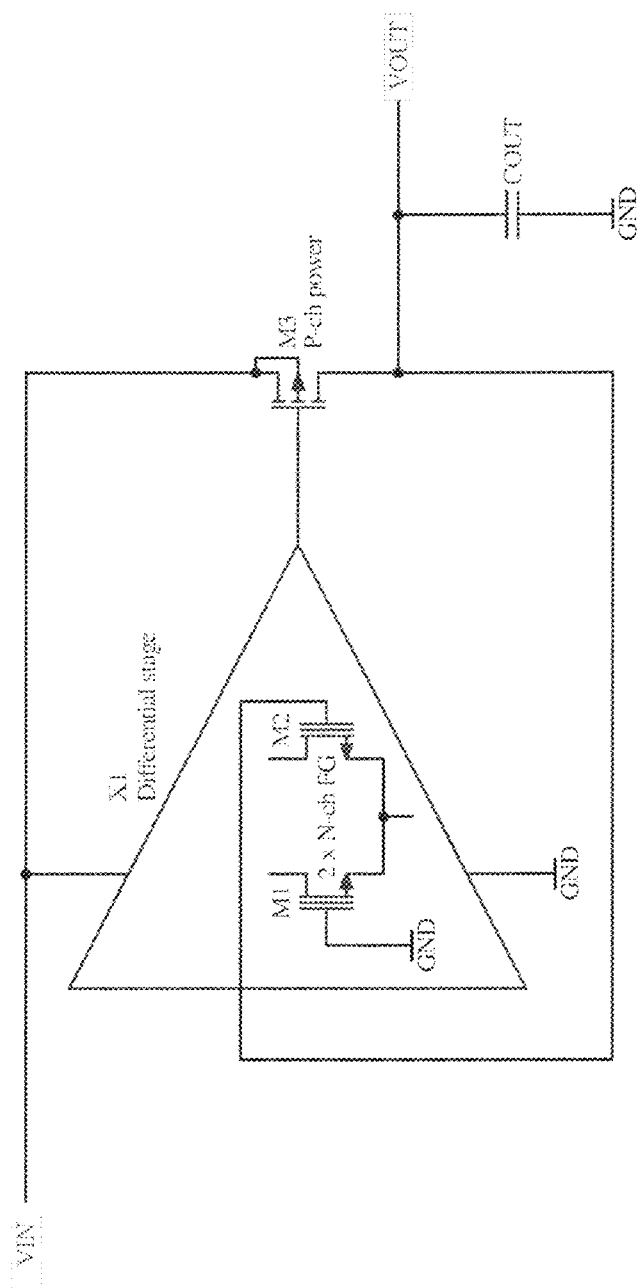
FIG. 6 shows a block diagram of a low-dropout (LDO) device.

The main diagram appears in FIG. 6. Consequently, the voltage stored behaves as an offset of the differential stage. Two approaches are possible. The offset voltage is incorporated in a single MOSFET or in both MOSFETs of the differential stage.

Figure 9:
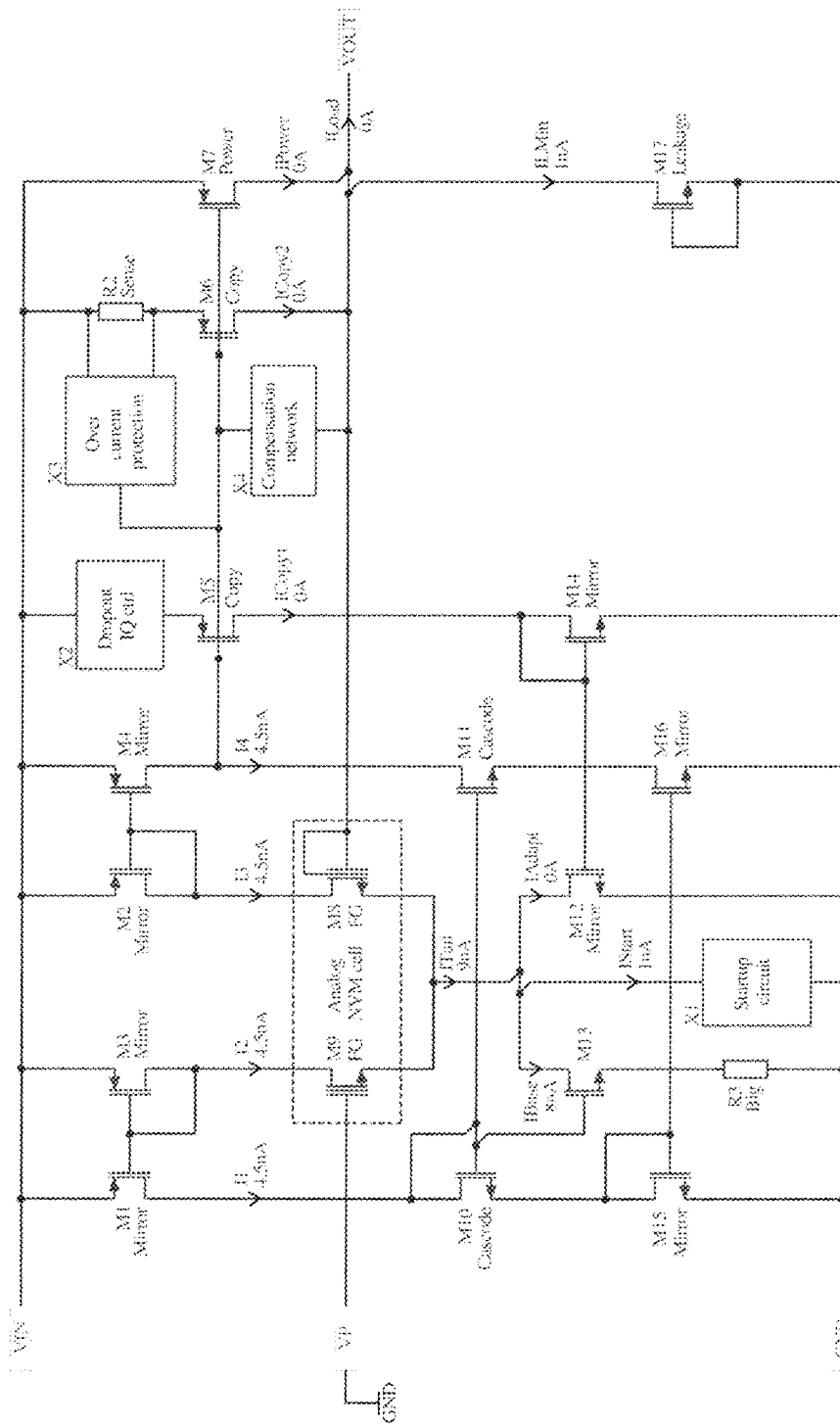
FIGS. 9 and 10 show two implementations of an LDO device.
Figure 10:
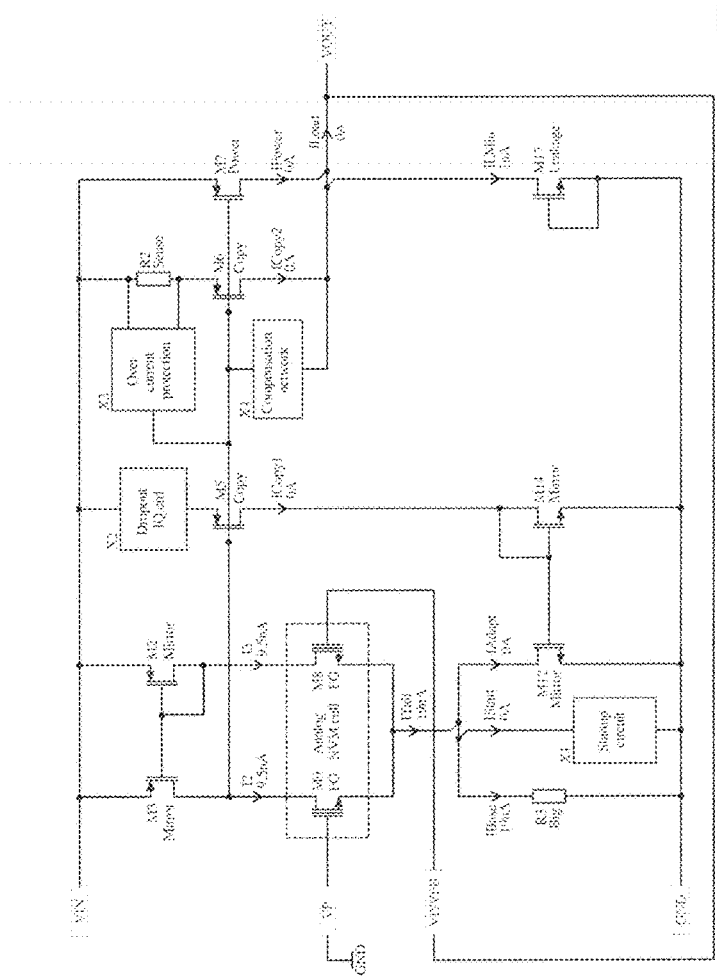

Various embodiments are consequently possible, some of which are based upon a single-ended implementation and some of which are based upon the differential implementation (see FIGS. 9 and 10).

Each embodiment presents some advantages, but also entails drawbacks. In particular, the single-ended version is easier to manage in terms of programming, but the precision could be worse. On the other hand, the differential version is more difficult to program, but the precision may be higher.

Hence, as has already been the, one or more embodiments may be designed to generate a reference voltage Vref using an innovative integration of an analogic NVM cell as voltage reference with characteristics similar to the voltage references obtained with bandgap circuits.

The new sphere of use imposes different considerations of an electrical nature as compared to the typical use of the cell as digital memory.

Various embodiments propose a solution for providing an electronic device for the generation of reference voltages that are stable and independent of temperature.

More in particular, the ensuing description is based upon the concept of floating gate (FG) that exists in an NVM cell. By "floating gate" is meant a node or terminal that has an electrical potential defined during programming/erasure and that remains practically unvaried in time (in a way independent of temperature).

In various embodiments, the memory cell becomes the fundamental element of the differential pair of a feedback operational amplifier, generating at output a reference voltage that directly depends upon the potential present on the FG terminal (i.e., proportional to the charge stored in the memory).

Consequently, it is possible to associate to the memory element a new "analogic" connotation with respect to the customary "digital" function.

Various embodiments are based on the use of an innovative memory cell of a single-polysilicon FG type that can be implemented using a standard CMOS process and without the need to use of additional masks. Consequently, the above memory cell is obtained in single-polysilicon technology.

The memory cell described and used herein has already formed the subject of a patent filed in the name of the present applicant entitled "Memory device with single selection transistor", issued in January 2013 under No. IT0001397228 (and counterpart U.S. Pat. No. 8,693,256).

The above memory cell has found wide use in EEPROM (Electrically Erasable Programmable Read-Only Memory) applications since, like the latter, also this memory cell makes it possible to modify the information contained inside it with very low levels of current consumptions enabling a high parallelism via the Fowler-Nordheim tunnelling phenomenon.

Tunnelling is the mechanism of conduction through an insulating layer and is based upon the phenomenon whereby the wave function of the electron can penetrate through a potential barrier. This mechanism has a marked dependence upon the voltage applied, but basically also depends upon temperature.

As is known, the tunnelling mechanisms may be direct or of a Fowler-Nordheim (FN) type. The Fowler-Nordheim phenomenon consists in tunnelling of electrons from the metal to the conduction band of the semiconductor, through a potential barrier of a triangular shape.

Various embodiments advantageously enable precise voltage references to be obtained (for example, with a precision in the region of ±3%, with possibility of even higher levels of precision), compensating the process spread with a considerable saving of area and consumption (≤1 μA).

In various embodiments, the possibility is exploited of creating electrical potentials in a floating terminal made available by the use of non-volatile memory cells as differential pair of an operational-amplifier structure, as shown in FIG. 8.

Two alternative embodiments are proposed for implementation of this new function, as explained more fully hereinafter.

Figure 7:
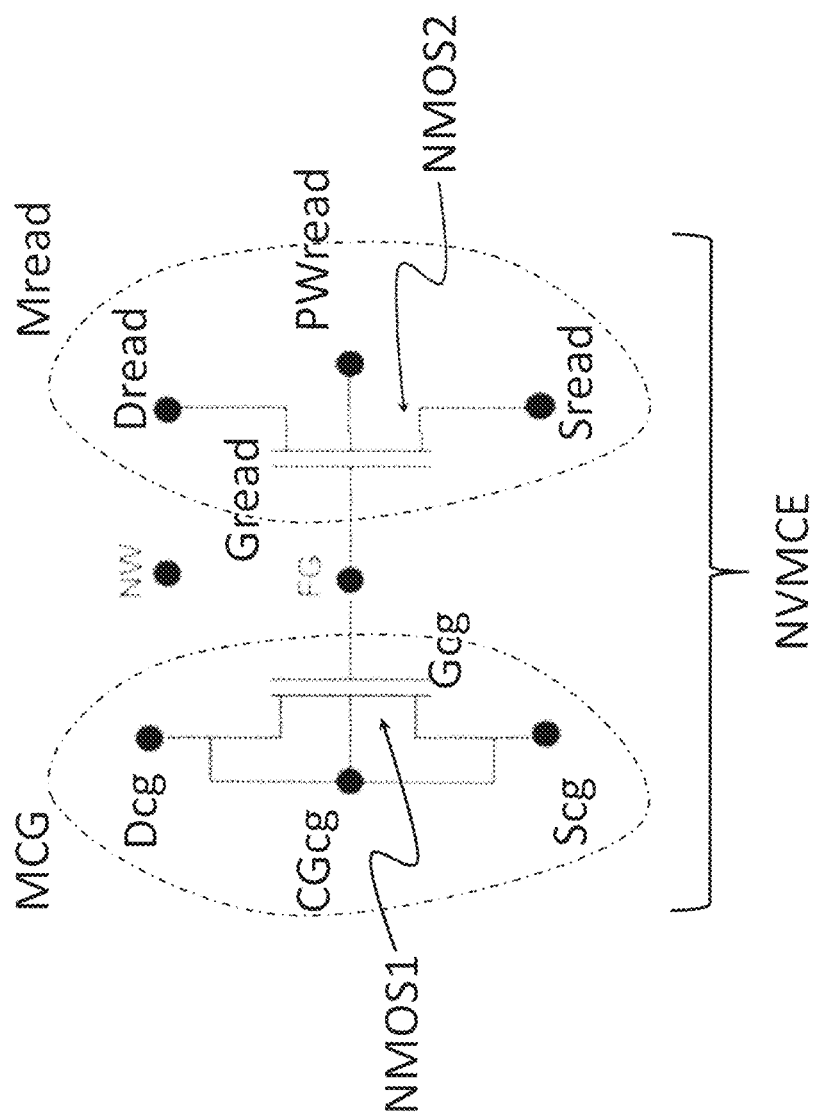
FIG. 7 shows an implementation of a single-polysilicon non-volatile memory cell.

In both embodiments, see FIG. 7, the floating-gate terminal FG is obtained by connecting together two NMOS transistors, i.e., NMOS1 and NMOS2, via their respective gate terminals.

The floating-gate terminal FG is consequently obtained on the common-gate node of the two transistors NMOS1 and NMOS2. In particular, the first transistor NMOS1 is the control-gate transistor MCG, whereas the second transistor NMOS2 is the reading transistor Mread. Consequently, the respective gate are designated by Gcg and Gread.

In particular, in the first transistor MCG the drain terminal Dcg and the source terminal Scg are connected together and define the control-gate terminal CG.

The second transistor Mread has, instead, three conduction terminals, i.e., Dread, Sread, and PWread.

Applied on the transistor MCG are the programming voltages for modifying the voltage on the intermediate floating-gate terminal FG.

In various embodiments, the Fowler-Nordheim phenomenon is used for programming and erasing the analogic non-volatile memory cell NVMCE, according to the voltage applied to the intermediate floating terminal NW, and on the basis of the conditions of the other conduction terminals Dread, Sread, and PWread of the memory cell it is possible to program or erase the memory cell.

As has been the previously, two different embodiments are possible.

In a first embodiment, the cell has a control-gate transistor MCG (which functions as capacitor for driving capacitively the floating-gate terminal FG) of larger size than the reading transistor Mread. This embodiment may be defined as "BIG Control Gate", in so far as in this case the area Acg of the control-gate transistor MCG is six times the area Aread of the reading transistor Mread, i.e., Acg=Aread·6.

In a second embodiment, the cell has a control-gate transistor MCG of smaller size than the reading transistor Mread. This embodiment may be defined as "SMALL Control Gate", and in this case the area of the control-gate transistor is one sixth of the area Aread of the reading transistor Mread, i.e., Acg=Aread/6.

The memory cells are described in the document U.S. Pat. No. 8,693,256.

This geometrical flexibility of integration renders application even more general, enabling adaptation of the solution to different requirements of sizing of the operational amplifier.

The programming and erasing functions are described hereinafter and summarized in Table 2.

Table 2 highlights the three basic operations to be carried for use of the innovative memory cell.

TABLE 2

Example of driving potentials of the analogic non-volatile memory cell NVMCE in the various operations; cell obtained in NMOS technology

| Cell Type | Operation | FG | CGcg | NW | PWread | Sread | Dread |
|---|---|---|---|---|---|---|---|
| Big Control Gate | Program | V↓ | Positive High V | Positive High V | ○ | ○ | ○ |
|  | Erase | V↑ | ○ | Positive High V | Positive High V | Positive High V | Positive High V |
|  | Operating | Retention | ○ | Supply | ○ | source voltage | drain voltage |
| Small Control | Program | V↓ | ○ | Positive | Positive | Positive | Positive |

TABLE 2-continued

Example of driving potentials of the analogic non-volatile memory cell
NVMCE in the various operations; cell obtained in NMOS technology

| Cell Type | Operation | FG | CGcg | NW | PWread | Sread | Dread |
|---|---|---|---|---|---|---|---|
| Gate | | | | High V | High V | High V | High V |
| | Erase | V↑ | Positive High V | Positive High V | ○ | Positive High V | ○ |
| | Operating | Retention | ○ | Positive High V | ○ | source voltage | drain voltage |

Both of the embodiments proposed enable biasing of the differential pair with currents of the order of hundreds of nanoamps, enabling creation of reference generators with levels of consumption lower than one milliamp.

Appearing in Table 2 are examples of driving potentials of the analogic non-volatile memory cell NVMCE for the two embodiments, namely, for the BIG Control Gate and for the SMALL Control Gate.

For each operation envisaged, namely, programming, erasure, and operation, indicated in the table are the potentials to be applied to the single control and conduction terminals, namely CGcg, NW, PWread, Sread, and Dread, and also the reaction that is obtained on the floating-gate terminal FG (V↓: voltage drops; V↑: voltage rises; Retention: voltage remains unvaried).

In particular, the potential of the floating-gate terminal can be modified as described previously via external access to the terminals CG and NW, or by integrating a high-voltage-generator circuit (charge pump).

As already mentioned previously, the cells shown in FIG. 7 may be integrated and inserted as differential pair of an operational amplifier, as shown in FIG. 8.

Figure 8A:
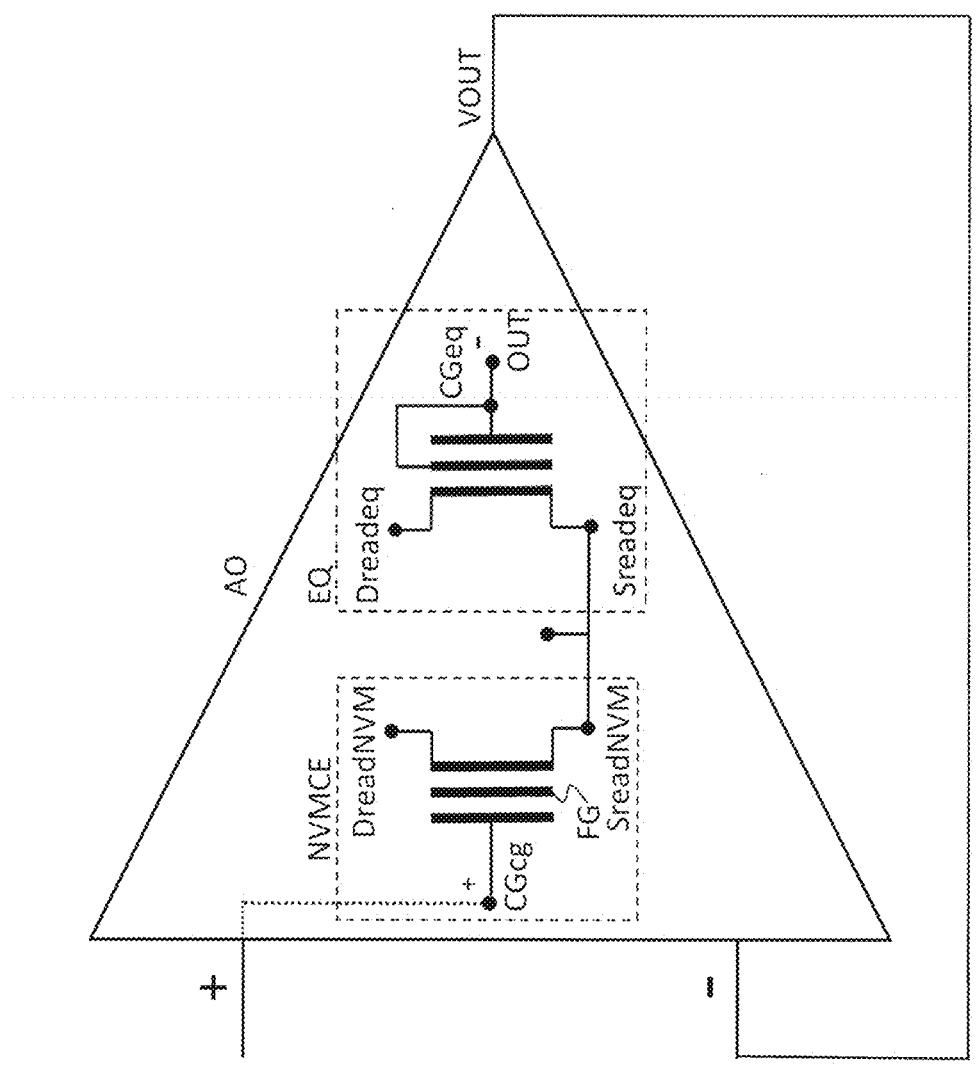
FIGS. 8A and 8B show embodiments of the solution proposed herein.
Figure 8B:
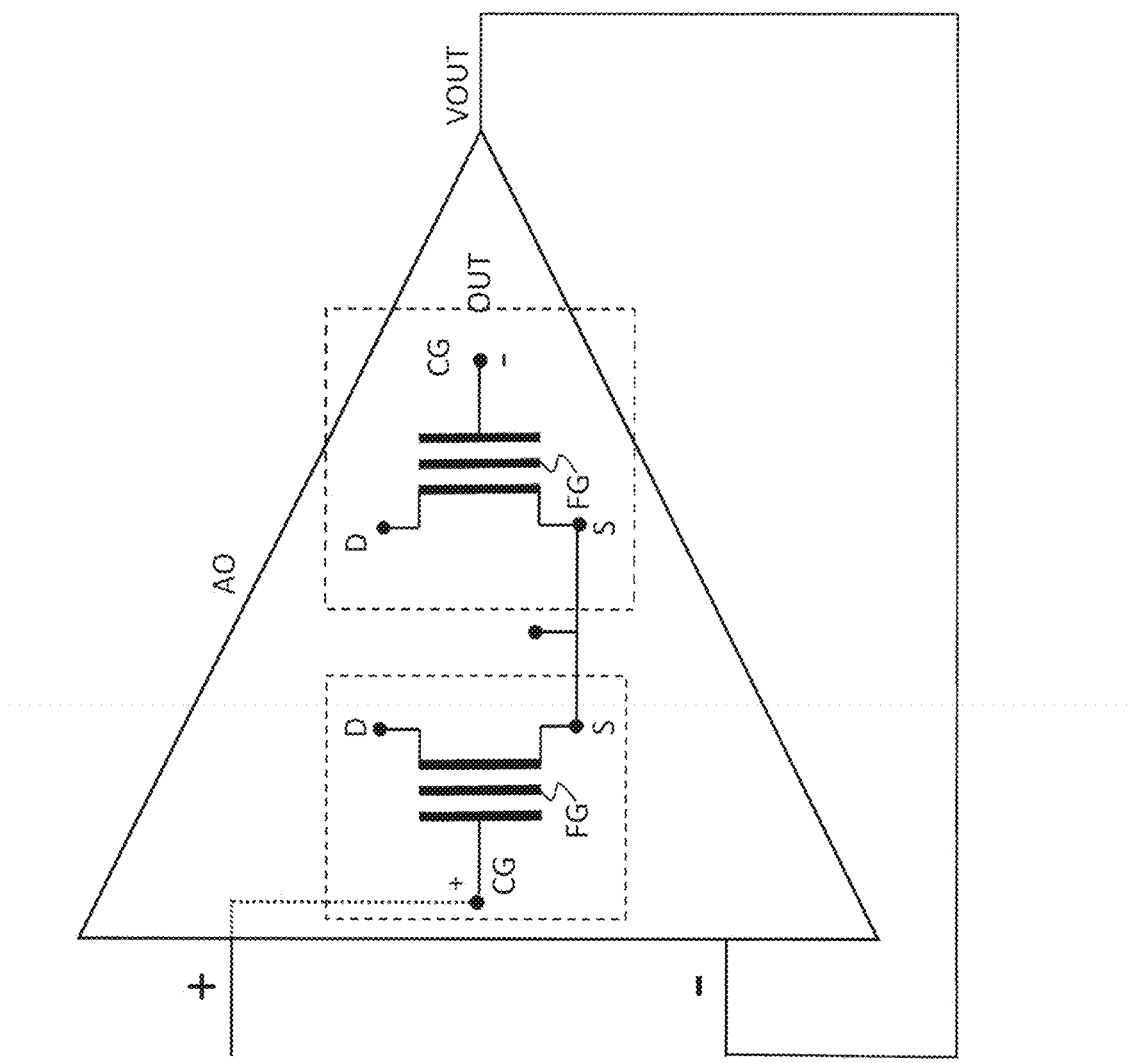

FIG. 8A shows the single-ended embodiment, whereas FIG. 8B shows the differential embodiment.

FIG. 8 shows two possible implementations that integrate a non-volatile memory cell.

One or more embodiments may be based on a single-ended configuration (FIG. 8A), which envisages use of one non-volatile memory cell, or on a differential configuration (FIG. 8B), which envisages use of two non-volatile memory cells, as explained more fully hereinafter.

In what follows, the structure of the operational amplifier as regards the biasing and compensation part will not be described in detail since these characteristics are not of interest in a preliminary analysis of the solution proposed herein.

The memory cell proposed is a different physical and architectural integration that affords many advantages.

Unlike the "digital" cell described in the document U.S. Pat. No. 8,693,256, the memory cell used herein acquires a new "analogic" connotation.

As compared to the known solution, the selector has been removed, given that it is no longer necessary for this particular application, and the mechanism of injection and extraction of electrons from the floating gate (Fowler-Nordheim phenomenon) is advantageously used, thus drawing advantage from all the considerations of reliability already available in FG technology without any additional masks.

The sizing may be rendered variable so as to maintain a degree of flexibility to be exploited in the design of the differential structure.

In one embodiment, illustrated in FIG. 8A, the solution envisages a single analogic cell NVMCE (single-ended approach).

This configuration reduces the area used and requires accessibility of a single control-gate terminal (CGcg) for enabling programming/erasure of the memory cell.

This solution can be implemented by mirroring the differential pair, hence with the cost-effective analogic cell NVMCE connected on the inverting branch and an equivalent cell EQ connected on the non-inverting branch.

In this case, the equivalent cell EQ has the control-gate terminal CGread connected to the floating gate of the reading transistor Mread of the equivalent cell and consequently cannot store charge (see FIG. 8A).

Consequently, the device for generating a reference voltage Vref comprises an operational amplifier AO, a first non-volatile memory cell NVMCE, which includes a control-gate transistor MCG and a reading transistor Mread.

The control-gate transistor MCG comprises a gate terminal Gcg, a body, and a first conduction terminal Dcg and a second conduction terminal Scg, connected together to form a control-gate terminal CGcg.

Instead, the reading transistor Mread comprises a gate terminal Gread, connected to the gate terminal Gcg of the control-gate transistor to form a floating-gate terminal FG, a body, and a third conduction terminal Dread and a fourth conduction terminal Sread.

The device also comprises a second memory cell.

In various embodiments (FIG. 8A), the second cell is an equivalent memory cell EQ, whereas in alternative embodiments (FIG. 8B) the second cell is also a non-volatile memory cell NVMCE.

In the device described herein the source terminal Sread-NVM of the first non-volatile memory cell NVMCE and the source terminal Sreadeq of the second memory cell are connected together.

In addition, the control-gate terminal CGcg of the first non-volatile memory cell NVMCE is connected on the inverting branch of the operational amplifier AO, and the control-gate terminal CGeq of the second, equivalent, memory cell EQ is connected on the non-inverting branch.

Finally, the reference voltage Vref is acquired on the floating-gate terminal FG and is determined by the conditions of supply of the conduction terminals CGcg, Sread, and Dread of the two memory cells NVMCE, EQ.

In an alternative embodiment, shown in FIG. 8B, the solution envisages the use of two cells NVMCE (differential approach).

In this embodiment, there are two operative and accessible control-gate terminals CGcg and CGeq.

This configuration enables a better performance to be achieved in terms of retention of the potential configured or else, given the same retention properties, higher output voltages to be reached.

This embodiment requires, however, accessibility of two terminals (both of the control-gate terminals of the two cells) during programming/erasure. In this embodiment, particular attention is required in formation of the control-gate terminal CG of the cell on the feedback path.

In various embodiments, it is possible to define the output voltage Vref or VOUT by appropriately configuring the potential of the floating-gate terminal FG of the memory cell, rendering the semiconductor used independent of the bandgap voltage.

The embodiments proposed consequently present constructional advantages over normal implementations, which are summarized hereinafter.

As a first advantage, the voltage generated on the floating-gate terminal is independent of the type of semiconductor used.

Furthermore, there is obtained a reduction in the levels of consumption to achieve similar performance.

Thanks to the structure used, a good independence of the output voltage from temperature is obtained.

A further advantage is represented by the reduction of the passive and active components, which hence entail a reduction of the process spread intrinsic in the structure.

By reducing the number of necessary components it is moreover possible to reduce the occupation of area of the structure for similar performance, a characteristic that is very positive in wearable devices.

Furthermore, no particular attention is necessary at the level of layout for eliminating the systematic offset that is to be compensated intrinsically during programming/erasure of the analogic memory cell.

As compared to known solutions, introduction of buffers downstream for driving the currents is consequently not necessary because the operational amplifier can be sized with the due driving capacity for generating the required currents.

With the embodiments described herein, there is the possibility of regulating voltages that are higher than those regulated with the known bandgap solution, without the need for cascaded operational amplifiers and associated resistors for implementing gain structures. There is consequently an intrinsic gain in area and an increase in precision.

Further advantages may be identified in an intrinsic configurability of the structure, which does not require digital calibration but only configuration of the potential of the terminal FG and hence enables output voltages VOUT to be obtained that are not fixed in the design stage, but are defined in-field for each chip according to the need through appropriate programming algorithms.

In addition, two different embodiments are possible according to the design constraints and mission profile or other design choices/requirements.

In order to improve the aspects of retention of the floating analogic potential present on the floating gate, there is proposed a division of the cell into various elements in parallel so as to reduce the effects of loss of electrical charge from the floating gate due to onset of defects in-field. In fact, if this phenomenon is local, with this solution would only have an impact on the element in which the loss of charge has been detected, with a lower incidence on the total charge stored.

The cost-effective analogic cell NVMCE may be implemented also in PMOS version for generating a dual reference with respect to the supply VIN (FIGS. 9 and 10).

Both with the PMOS implementation and with the NMOS implementation voltages of o V (Table 3) may be reached. This solution introduces objective advantages in some particular applications/uses, preserving all the aspects listed above of the NMOS version.

All the foregoing considerations apply also to this implementation.

TABLE 3

Driving potentials of the analogic non-volatile memory cell NVMCE in the various operations obtained in PMOS technology

| Cell Type | Operation | FG | CG | NW | S | D |
|---|---|---|---|---|---|---|
| PMOS Big Control Gate | Program | V↓ | Positive High V | ○ | ○ | ○ |
| | Erase | V↑ | ○ | Positive High V | Positive High V | Positive High V |
| | Operating | Retention | Supply | Supply | source voltage | drain voltage |
| PMOS Small Control Gate | Program | V↓ | ○ | Positive High V | Positive High V | Positive High V |
| | Erase | V↑ | Positive High V | ○ | ○ | ○ |
| | Operating | Retention | Supply | Supply | source voltage | drain voltage |

As has already been the previously, the main application of the voltage-regulator devices described herein is in LDO regulators with ultra-low quiescent current.

The main purpose for development of LDO regulators was to achieve a quiescent current $I_Q$ of 20 nA. It is an ultra-low current that does not enable the use of complex structures.

The architecture must reflect also the requirements of stability of the loop. On the basis of these requirements it has been decided to set the number of stages at two differential stages plus one power MOSFET.

The main diagram of the regulator is illustrated in FIG. 4. The differential pair that incorporates the analogic NVM cell is based upon N-channel MOSFETs with floating gates. The polarity of the transistors has been selected for guaranteeing a common input voltage of the differential stage that can reach the level of the supply voltage (VIN).

Since a current $I_Q$ of 20 nA does not enable use of any resistive divider, the level of voltage Vref stored inside must be equal to the nominal level VOUT. For this reason the operational amplifier AO works in unit-gain configuration.

Two different implementations of the LDO circuit regulator have been developed. In the first, the single-ended configuration of the analogic NVM cell already described previously is used.

The diagram is shown in FIG. 9. The memory cell is represented by the differential pair (M9, M8). In this configuration, just one of the two MOSFETs (the left-hand one—M9) maintains the charge/voltage programmed.

The second (the right-hand one—M8) has the floating gate terminal shorted with the control gate in such a way that it is unable to store any charge/voltage; instead, it functions in active mode, receiving the feedback signal from the output.

Electrically the pair behaves as a standard differential pair, but with a certain programmed offset.

The pair is coupled to a set of current mirrors (M1, M2, M3, M4, M12, M14, M15, M16), which form a fully differential stage. In order to improve some electrical characteristics of the LDO, in particular the dropout voltage (VDROP), it is necessary to maximize the oscillation of the output voltage of the stage. For these reasons, the structure contains four branches that guarantee a rail-to-rail output.

Generation of the tail current (ITail) represents a problem because the level is only of 9 nA.

This problem is solved by the generator VGS/R based upon a self-biasing technique. The self-biasing cycle is incorporated in the left-hand side of the differential stage.

Using the cascode potential of the low-side part (gates of M10, M11) and with the aid of M13 a constant potential is defined on the resistance R3, with consequent constant biasing current.

The value of the resistance R3 is several tens of megaohms. Since the generator ITail is self-biased, it has two stable operating points. The operating point at zero current is avoided by a start-up circuit X1, which injects a small d.c. leakage current and a higher pulsed current during the start-up period.

The start-up circuit is very important because the amplifier contains important charge-storage elements, but the biasing currents are ultra-low. In fact, the compensation network X4 connected between the gate and the drain of the power MOSFET M7 form an active integrator.

In order to guarantee a reasonable start-up time in an interval of a few milliseconds it is necessary to increase the current of the differential stage in the start-up period.

The level of $I_Q$ at 20 nA must be guaranteed only at zero load (zero load current ILOAD). In conditions of increased load it is possible to increase the current consumption.

This entails two main advantages: better dynamic performance and easier frequency compensation.

This is obtained by the adaptive biasing path copying the MOSFET M5 and the current mirror M14, M12.

The copied MOSFET mirrors the current ILOAD. As the current ILOAD increases the total current frail increases. The present current interval ITail ranges from 20 nA to 30 µA. The dropout condition represents the specific case where the current ILOAD may be, for example, zero, but the voltage VGS of the power MOSFET M7 may be maximum. From the standpoint of the level of $I_Q$ this is a critical condition because the current in the adaptive biasing path may be extremely high. To keep the current $I_Q$ under control a circuit X2 implemented in the biasing path is used. It enables reduction of the maximum level of the current ICopy1 and consequently of the total current $I_Q$.

The regulator is protected against overcurrent by the protection circuit X3. The level of the current ILOAD is detected by a copy branch formed by the MOSFET M6 and the resistance R2.

The current ICopy2 is a small replica of the current ILOAD (assuming that there is a small voltage drop on R2). The voltage drop on R2, which corresponds to the level ILOAD, is processed by the overcurrent-protection block X3, where it is compared with an incorporated voltage offset. Once the threshold has been reached, the output of the block X3 starts to limit the voltage VGS of the power MOSFET M7 and hence to limit the maximum level of the current ILOAD.

As mentioned previously, the regulator is built in two gain stages. In addition, it functions in conditions of high capacitive load. For stable operation it must be integrated with an adequate compensation network.

In the diagram, the compensation network is represented by the block X4. It is based upon the principle of Miller adaptive compensation. It works between the gate and the source of the power MOSFET M7. The movement of the output pole is compensated by shifting of the zero guided by the current ILOAD.

On account of the adaptive biasing technique used in the differential pair, also the non-dominant pole on the gate of the power MOSFET is moving. All these facts contribute to creating the well-compensated response system.

For the programming procedure, the input VP is made accessible at package level. Normally, the pin will be connected to ground in use. In post-package programming, the pin will be supplied with high-voltage programming pulses. It must be able to receive high voltage in both of the polarities, enabling the operations of programming/erasure.

The device is designed to work principally in closed-loop (regulation) condition, but it may happen that the supply voltage VIN can drop, forcing the loop into dropout mode. In this case, the quiescent current could increase by several orders of magnitude on account of the adaptive biasing circuit. The increase of the current $I_Q$ in this situation is kept under control by the block "Dropout IQ ctrl" X2.

The second embodiment (FIG. 10) uses the differential version of the analogic NVM cell. In this case, both of the floating-gate terminals of the differential MOSFETs store a programmed charge of some sort.

To enable programming of the floating-gate MOSFETs M9, M8, their gate terminals are connected outside the device.

The pins must accept high programming voltages in both polarities. In normal operation, the input VP is at ground and the input VP/VFB is used as a feedback node for detection of the voltage VOUT.

The differential pair is coupled with a current mirror M3, M4, which completes the differential stage. In this implementation, the differential stage is simpler than in the previous one. Only two branches are used. The output of the stage is quasi rail-to-rail with a small limitation in the low branch. This behavior is obtained with a specific constellation of the programmed voltages.

The voltages programmed within the MOSFETs M9, M8 are fundamental for proper operation of the device. They not only define the level VOUT but also contribute to generation of the biasing current ITail and to definition of the oscillation of the output voltage. It is evident that the current ITail is defined merely by the resistor R3.

To generate a constant biasing current it is necessary to define a constant voltage on the resistor.

This is obtained by programming a fixed voltage level, around 1.2 V, in the left-hand device M9. This voltage ensures that the voltage on the resistor R3 will be (1.2 V−VGS), and a constant current will flow in the differential stage. The MOSFET M8 on the right is programmed, according to the desired level VOUT, as follows:

$$V\_M8 = V\_M9 - VOUT$$

where V_M9=1.2 V

This entails that to obtain a voltage VOUT>1.2 V the transistor M8 must be programmed with a negative voltage.

This approach enables also a high oscillation on the output of the stage to be obtained. Since the voltage in the common source of the differential stage is equal to (1.2V−VGS), the gate of the power MOSFET M7 may be brought down to this level.

The start-up circuit X1 is simpler. It is used only for injection of a higher biasing current during the start-up period. In effect, the biasing-generation structure is not self-biased so that no zero operating point is present. In steady-state conditions, the current IStart is zero. All the other parts of the regulator are the same as in the previous case.

There are various advantages in the differential embodiment of the analogic NVM cell. In particular, it is possible to obtain a greater precision because both of the devices of the differential pair are used in the same way.

Thus the common-mode effects could be eliminated. Furthermore, the differential stage containing two branches is simpler.

On the other hand, the structure presents some drawbacks. It is more difficult to manage the structure from the programming standpoint. Both of the gates of the floating-gate MOSFETs must be accessible from outside and must accept a high voltage in both polarities. Also the fact that the feedback signal passes through the floating gate of the MOSFET M8 (capacitive divider) lead to certain complications.

Of course, without prejudice to the principle of the invention, the details of construction and the embodiments may vary widely with respect to what has been described and illustrated herein purely by way of example, without thereby departing from the scope of the present invention, as defined in the ensuing claims.

What is claimed is:

1. A device for generating a reference voltage, the device comprising:
    a first non-volatile memory cell comprising a control-gate transistor and a reading transistor; and
    a second equivalent memory cell;
    wherein the control-gate transistor comprises a gate terminal, a body, a first conduction terminal, and a second conduction terminal, the first conduction terminal and the second conduction terminal being connected together to form a control-gate terminal; and
    wherein the reading transistor comprises a gate terminal connected to the gate terminal of the control-gate transistor to form a floating-gate terminal, a body, a third conduction terminal and a fourth conduction terminal;
    wherein a source terminal of the first non-volatile memory cell and a source terminal of the second equivalent memory cell are connected together; and
    wherein the device is configured so that the reference voltage is acquired on the floating-gate terminal and is determined by conditions of supply of conduction terminals of the first non-volatile memory cell and the second equivalent memory cell.

2. The device according to claim 1, wherein the second equivalent memory cell includes a reading transistor that has a control-gate terminal connected to floating-gate terminal.

3. The device according to claim 1, wherein the second equivalent memory cell comprises a non-volatile memory cell comprising a control-gate transistor and a reading transistor and defining a second floating-gate terminal.

4. The device according to claim 1, wherein, in the first non-volatile memory cell, an area of the control-gate transistor is larger than an area of the reading transistor.

5. The device according to claim 4, wherein the area of the control-gate transistor and the area of the reading transistor are in a ratio 6:1.

6. The device according to claim 1, wherein, in the first non-volatile memory cell, an area of the control-gate transistor is smaller than an area of the reading transistor.

7. The device according to claim 6, wherein the area of the control-gate transistor and the area of the reading transistor are in a ratio 1:6.

8. The device according to claim 1, wherein the control-gate transistor and reading transistor comprise NMOS transistors.

9. The device according to claim 1, wherein the control-gate transistor and reading transistor comprise PMOS transistors.

10. A system comprising an operational amplifier and the device for generating a reference voltage according to claim 1, wherein the device for generating a reference voltage is inserted as a differential pair in the operational amplifier, wherein the control-gate terminal of the first non-volatile memory cell is connected on an inverting branch of the operational amplifier and a control-gate terminal of the second equivalent memory cell is connected on a non-inverting branch of the operational amplifier.

11. A device comprising:
    a first control-gate transistor comprising a gate terminal, a body, a first conduction terminal, and a second conduction terminal, the first conduction terminal and the second conduction terminal being connected together to form a first control-gate terminal;
    a first reading transistor comprising a gate terminal connected to the gate terminal of the first control-gate transistor to form a first floating-gate terminal, a body, a third conduction terminal and a fourth conduction terminal, the gate terminal of the first reading transistor connected to the gate terminal of the first control-gate transistor to form a first floating-gate terminal;
    a second control-gate transistor comprising a gate terminal, a body, a fifth conduction terminal, and a sixth conduction terminal, the fifth conduction terminal and the sixth conduction terminal being connected together to form a second control-gate terminal; and
    a second reading transistor comprising a gate terminal, a body, a seventh conduction terminal and an eighth conduction terminal, the gate terminal of the second reading transistor connected to the gate terminal of the second control-gate transistor to form a floating-gate terminal, wherein the fourth conduction terminal and the eighth conduction terminal are connected together.

12. The device according to claim 11, wherein the device is configured so that a reference voltage is acquired on the first floating-gate terminal and is determined by conditions of supply of the first control-gate terminal, the second control-gate terminal, the third conduction terminal, the fourth conduction terminal, the seventh conduction terminal, and the eighth conduction terminal.

13. The device according to claim 11, wherein the device comprises a differential pair in an operational amplifier.

14. The device according to claim 13, wherein the first control-gate terminal is connected on an inverting branch of the operational amplifier and the second control-gate terminal is connected on a non-inverting branch of the operational amplifier.

15. The device according to claim 11, wherein the first control-gate transistor has an area that is larger than an area of the first reading transistor.

16. The device according to claim 11, wherein the first control-gate transistor has an area that is smaller than an area of the first reading transistor.

17. A device for generating a reference voltage, the device comprising:
    a first non-volatile memory cell comprising a first control-gate transistor and a first reading transistor; and
    a second non-volatile memory cell comprising a second control-gate transistor and a second reading transistor;
    wherein the first control-gate transistor comprises a gate terminal, a body, a drain terminal, and a source terminal, the drain terminal and the source terminal being connected together to form a first control-gate terminal;

wherein the first reading transistor comprises a gate terminal, a body, a drain terminal, and a source terminal, the gate terminal of the first reading transistor being connected to the gate terminal of the first control-gate transistor to form a first floating-gate terminal;

wherein the second control-gate transistor comprises a gate terminal, a body, a drain terminal, and a source terminal, the drain terminal and the source terminal being connected together to form a second control-gate terminal;

wherein the second reading transistor comprises a gate terminal, a body, a drain terminal, and a source terminal, the gate terminal of the second reading transistor being connected to the gate terminal of the second control-gate transistor to form a second floating-gate terminal; and wherein the source terminal of the first reading transistor and the source terminal of the second reading transistor are connected together.

18. The device according to claim 17, wherein the device is configured so that a reference voltage is acquired on the first floating-gate terminal and is determined by conditions of supply of conduction terminals of the first non-volatile memory cell and the second non-volatile memory cell.

19. The device according to claim 17, wherein an area of the first control-gate transistor is at least six times larger than an area of the first reading transistor.

20. The device according to claim 17, wherein an area of the first control-gate transistor is at least six times smaller than an area of the first reading transistor.

* * * * *